United States Patent [19]

Nakagawa et al.

[11] Patent Number: 5,863,709
[45] Date of Patent: *Jan. 26, 1999

[54] DEEP UV PHOTOLITHOGRAPHY WITH REDUCED HALATION

[75] Inventors: Kenji Nakagawa; Katsuyoshi Kobayashi, both of Kawasaki, Japan

[73] Assignee: Fujitsu Limited, Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 531,657

[22] Filed: Sep. 21, 1995

[30] Foreign Application Priority Data

Dec. 21, 1994 [JP] Japan ...................................... 6-318740

[51] Int. Cl.$^6$ ....................................................... G03C 5/00
[52] U.S. Cl. ........................... 430/326; 430/322; 430/396
[58] Field of Search ..................................... 430/326, 322, 430/396

[56] References Cited

U.S. PATENT DOCUMENTS

| | | | |
|---|---|---|---|
| 4,654,292 | 3/1987 | Oie et al. | 430/197 |
| 4,668,606 | 5/1987 | DoMinh et al. | 430/271 |
| 5,068,319 | 11/1991 | Brown et al. | 534/759 |
| 5,219,701 | 6/1993 | Schultz et al. | 430/191 |
| 5,275,909 | 1/1994 | Jayaraman et al. | 430/165 |
| 5,334,481 | 8/1994 | Merrem | 430/191 |

OTHER PUBLICATIONS

W.S. DeForest, Photoresist, McGraw–Hill, NY, 1975, p. 134.
Proceedings of SPIE vol. 2197 Optical/Laser Microlithography VII 2–4 Mar. 1994 San Jose, California pp. 637–647. Garza et al.

*Primary Examiner*—Janet Baxter
*Assistant Examiner*—Rosemary Ashton
*Attorney, Agent, or Firm*—Armstrong, Westerman, Hattori, McLeland & Naughton

[57] ABSTRACT

A pattern forming method includes the steps of preparing an underlie layer having a surface to be processed; coating a resist film on the underlie layer, the resist film including a substance capable ot absorbing light applied during exposure, thereby capable of attenuating light reflected from the surface of said underlie layer during the exposure, in comparison to a resist film not containing the substance; and transferring a pattern of a photomask onto the resist by using a modified illumination system, the photomask, and a projecting lens, the modified illumination system radiating principal light from the direction offset from an optical axis of a condenser lens. Exposure is performed by relieving the influence of light reflection from an underlie layer surface by using resists whose transmittance have been adjusted, and by using a stepper with a modified illumination system. A sufficient depth of focus is obtained and the resolution of the resist is substantially improved. A resist pattern of a good shape can be obtained by relieving the influence of light reflection from the underlie layer surface.

6 Claims, 11 Drawing Sheets

FIG.1A PRIOR ART
FIG.1B PRIOR ART
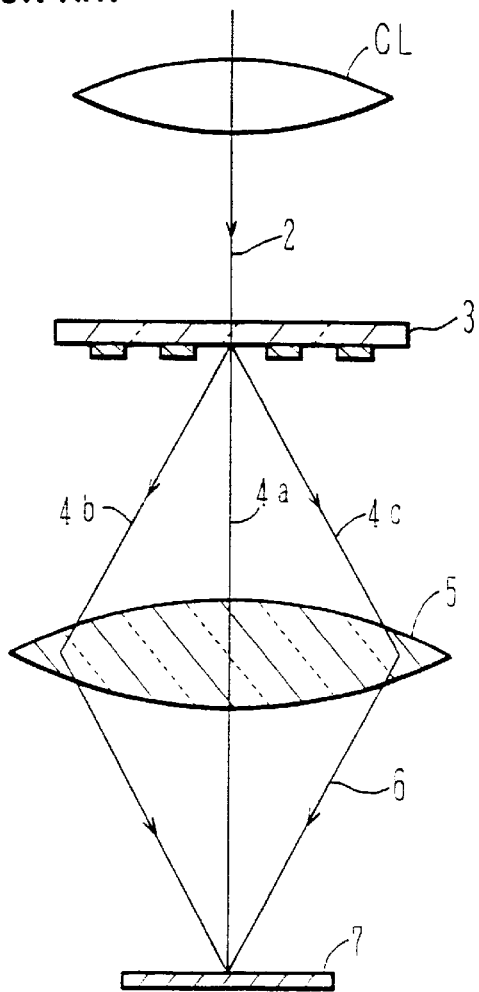
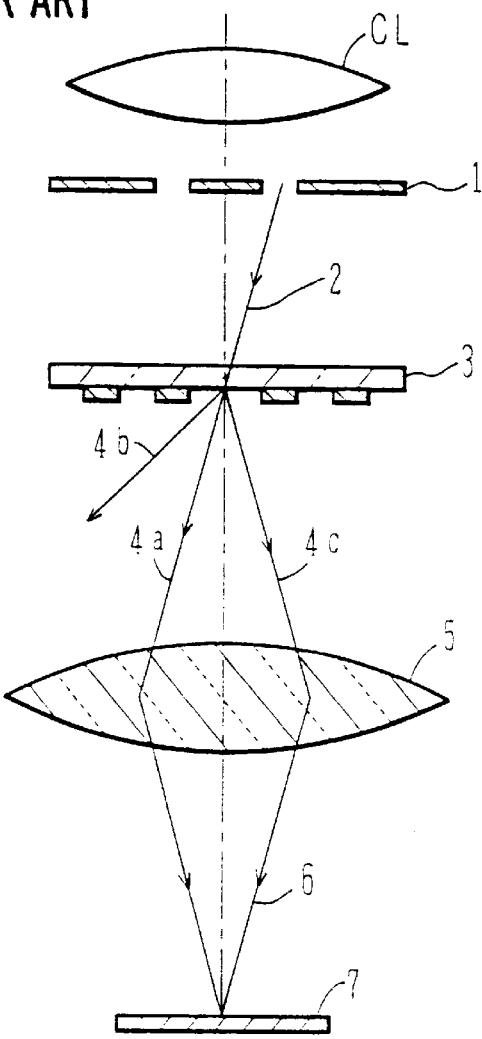
FIG.1C
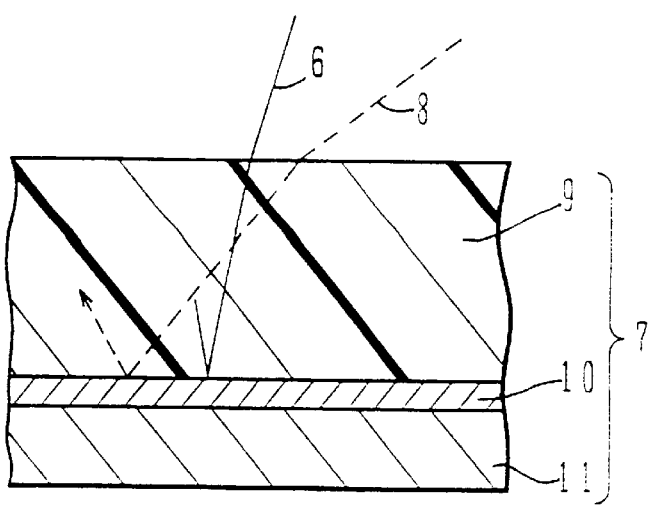

PRIOR ART FIG.2A
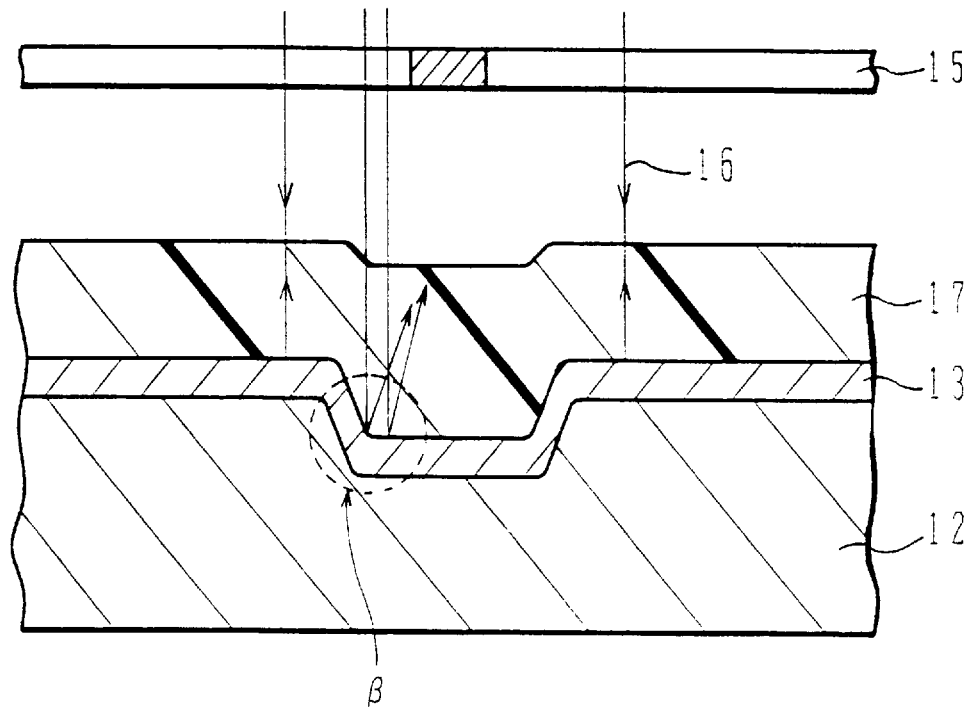
PRIOR ART FIG.2B
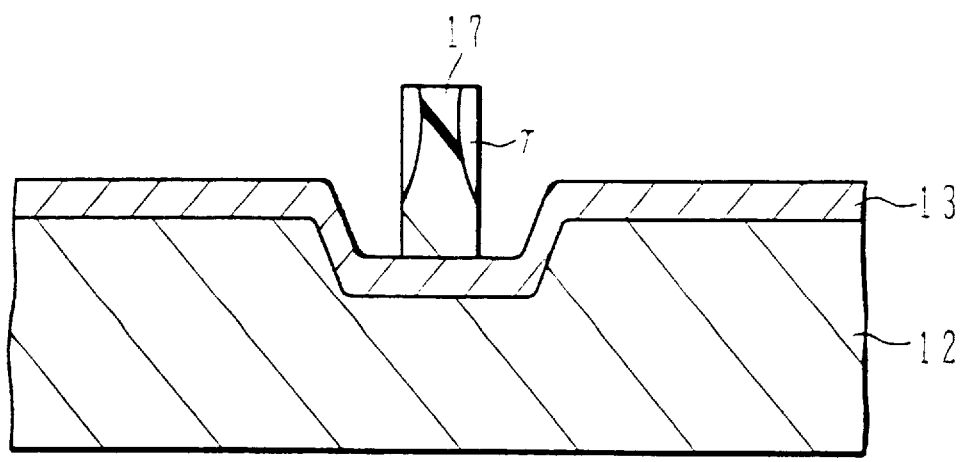

PRIOR ART  FIG.3A
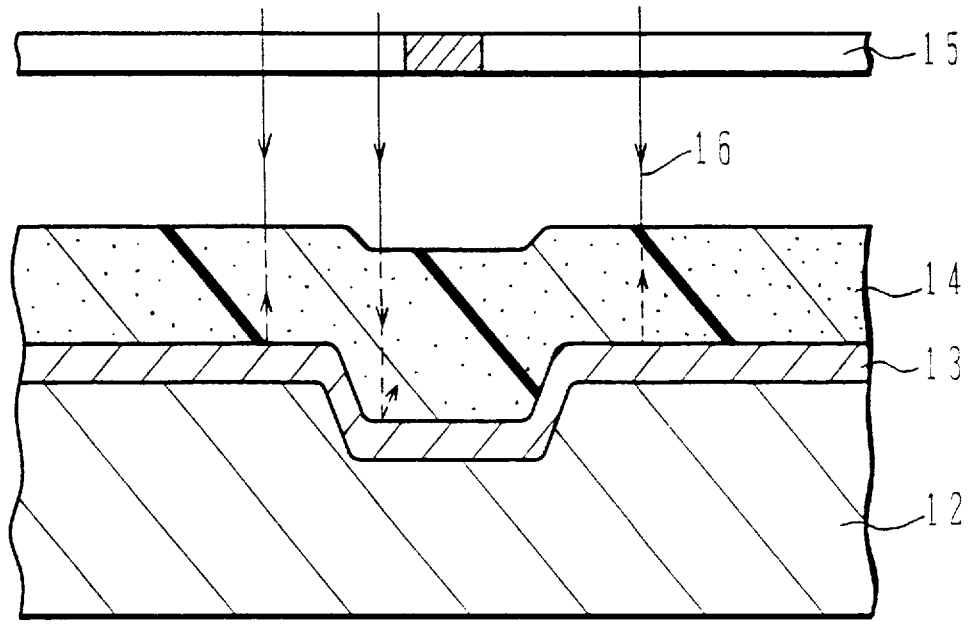
PRIOR ART  FIG.3B
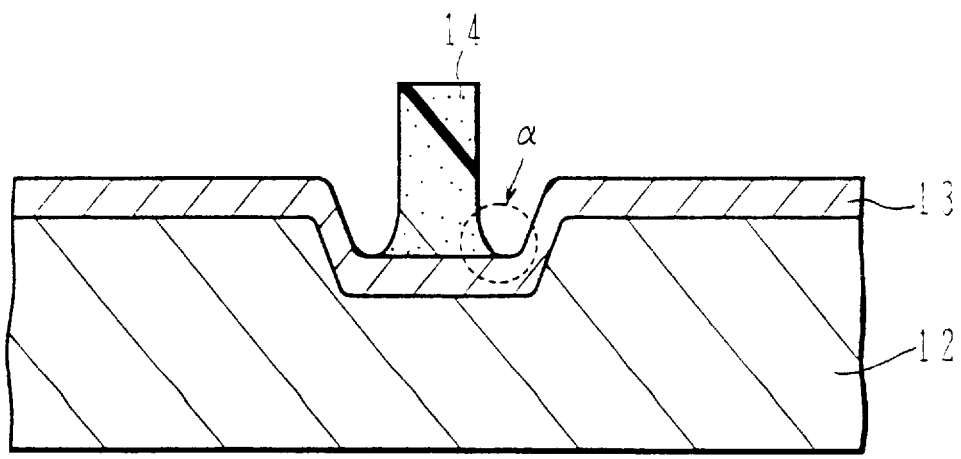

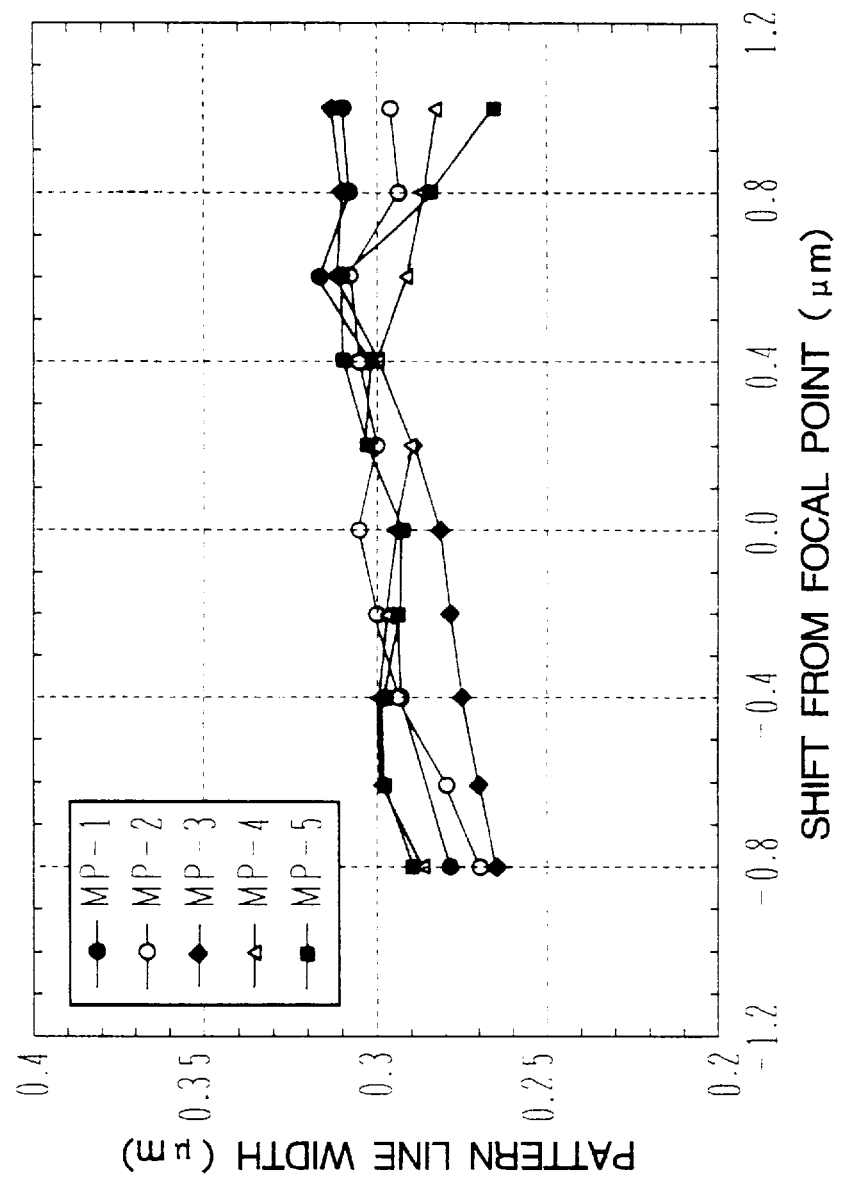

DEEP UV PHOTOLITHOGRAPHY WITH REDUCED HALATION

BACKGROUND OF THE INVENTION a) Field of the Invention

The present invention relates to photolithography for semiconductor fine patterning processes, and more particularly to a method of forming a fine resist pattern on a conductive thin film which reflects exposure light.

b) Description of the Related Art

For high integration of semiconductor integrated circuit devices, not only fine patterns are required but also high resolution of photolithography is necessary. In order to improve the resolution, the wavelength of exposure light tends to become short and the numerical aperture of a lens system in a stepper tends to become large. This tendency narrows a pitch between interference stripes on an exposure surface.

In addition to the above problem, there are other problems associated with device fine pattern formation. One of these problems resides in that a resist pattern is deformed by the light reflected from the surface of an underlie layer on the substrate, and the other resides in that the depth of focus becomes insufficient.

The light reflection problem occurs when a resist pattern is formed on a conductive film having a high reflectivity relative to exposure light. Exposure light incident upon a resist film is reflected at the surface of the conductive film. Standing waves generated by interference between incident light and reflected light forms a repetitive exposure intensity distribution in the thickness direction of a resist film, and the cross section of the developed resist film is corrugated. If the surface of the underlie layer on the substrate is irregular, scattering and converging of reflected lights occur depending on the irregular shape. Convergence of reflected lights in particular causes halation.

Exposure is performed nowadays by using excimer light (KrF 248 nm). In this case, reflection at silicon itself of the substrate is also strong and similar light reflection problem occurs.

For the light reflection problem, a method of laminating an antireflection film on a conductive film or a use of dye-containing resist has been tried. See J. J. Ferrari, "Comparison of Deep UV Reflection Control Method for Interconnect Layers", Proceedings of the SPIE, Vol. 2197, pp. 660–668, 1994, and Willard Conley, "Improved Reflectivity Control of APEX-E Positive Tone Deep UV Photoresist", Proceedings of the SPIE, Vol. 2195, pp.461–477, 1994. Both the methods relieve the influence of reflected light by attenuating exposure light reflected from the conductive film surface and returned to the resist film to lower the intensity of light.

The use of an antireflection film requires an additional process of forming the antireflection film on a conductive film. In contrast, use of dye-containing resist does not increase the number of processes because it is sufficient if only the resist is replaced.

In forming a high precision pattern on an irregular surface, a deeper depth of focus is required. However, the numerical aperture of a lens system in a stepper is increasing in order to improve the resolution. A large numerical aperture makes the depth of focus shallow and makes it insufficient. As a method of realizing a deeper depth of focus, an exposure method (modified exposure method) has been proposed recently, which uses a modified illumination system in which principal illumination light is inclined relative to the principal optical axis. See Keiichiro Tounai, "Optimization of Modified Illumination for 0.25 $\mu$m Resist Patterning", Proceedings of the SPIE, Vol. 2197, pp. 31–41, 1994.

With a normal illumination method (a general exposure method without a modified illumination system in which principal illumination light is in parallel with the optical axis), and 0th order light is incident upon a substrate in the vertical direction. Light fluxes of +1st order light and −1st order light diverge on both sides of the 0th order light at an equal angle. In order to focus an image, three light fluxes including the 0th, +1st, and −1st order light fluxes are required to be converged. With the modified illumination method, 0th order light is incident in the oblique direction. In order to focus an image, 0th and +1st order light fluxes or 0th and −1st order light fluxes are required to be converged. One light flux among the three light beams can be omitted. Therefore, an angle formed by two focusing light fluxes at a substrate becomes small (about a half) and therefore the depth of focus can be made deeper.

Use of an antireflection film is effective for reducing reflected light. However, this method is not effective for the problem of an insufficient depth of focus, and increases the number of processes.

Use of dye-containing resist can relieve the influence of reflection from an underlie film. However, this method cannot solve the problem of an insufficient depth of focus. According to the experiments made by the present inventors, dye-containing resist lowers an image forming ability.

Exposure using a modified illumination system can make the depth of focus deeper. However, this method cannot solve the problem of deformation of a pattern shape by the influence of reflected light, especially halation.

SUMMARY OF THE INVENTION

It is an object of the present invention to provide a pattern forming method capable of forming a precise and well-shaped resist pattern on a highly reflective and conductive film.

According to one aspect of the present invention, there is provided a pattern forming method comprising the steps of: preparing an underlie layer having a surface to be processed; coating a resist film on the underlie layer, resist of the resist film being added with substance capable of absorbing light applied during exposure, light reflected from the surface of the underlie layer during the exposure being capable of being attenuated by a certain amount more than using only resist not containing the substance, by adjusting the material of the additive substance and additive amount; and transferring a pattern of a photomask onto the resist film by using a modified illumination system, the photomask, and a projecting lens, the modified illumination system radiating principal light from the direction offset from an optical axis of a condenser lens.

The "principal" light means components larger than other components. For example, if a peak light intensity is at an angle $\theta$ ($\theta \neq 0$) inclined from the vertical direction, the "principal" light is in the direction shifted from the vertical direction.

Resist added with substance capable of absorbing light applied during exposure lowers the intensity of light reflected from an underlie layer surface and suppresses the deformation of a resist pattern to be caused by the influence of reflected light. However, if a normal illumination system is used, an image of a line pattern having a line width of 0.3 $\mu$m was not able to be formed.

If exposure is performed by using a modified illumination system and dye-containing resist, an image of a line pattern having a line width of 0.3 μm was able to be formed, a depth of focus was made deeper, and the influence of reflected light was relieved. These results may be considered as resulting from that a maximum optical path length of light being incident upon the resist and reaching the underlie layer surface is shortened and that the exposure light is attenuated by dye.

As above, photolithography can be realized which can maintain substantially a high resolution of resist under the exposure condition of a deeper depth of focus while suppressing the deformation of a resist pattern to be caused by the influence of light reflection at an underlie layer surface during the exposure, without increasing the number of processes.

BRIEF DESCRIPTION OF THE DRAWINGS

FIGS. 1A to 1C are cross sectional views showing the optical systems of steppers respectively having a normal illumination system and a modified illumination system, and optical paths in a resist film.

FIGS. 2A and 2B are cross sectional views showing an example of a pattern forming process using dye-containing resist.

FIGS. 3A and 3B are cross sectional views showing an example of a pattern forming process using usual resist.

FIG. 5A is a graph showing the relationship between a line width and a shift from a focal point of a resist pattern formed by Case B wherein usual resist and a modified illumination system are used.

DETAILED DESCRIPTION OF THE PREFERRED EMBODIMENTS

Figure 4A:
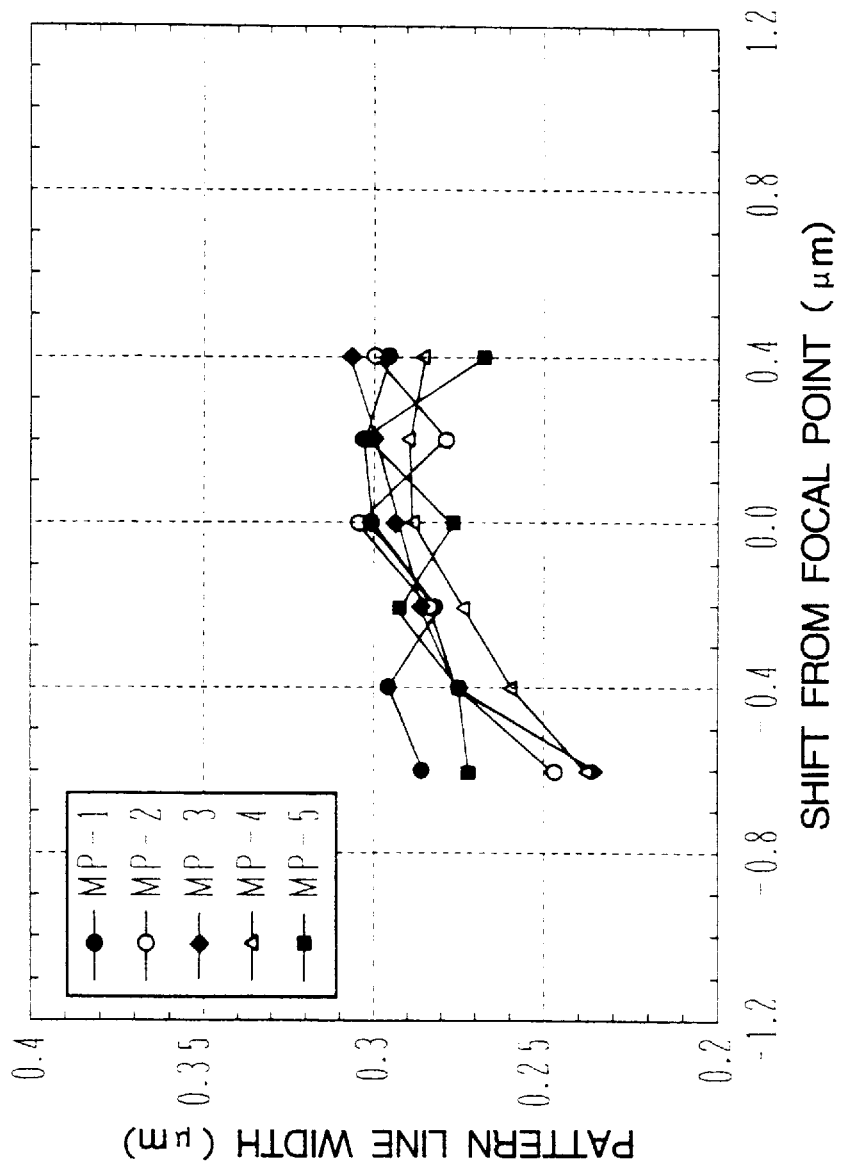
FIG. 4A is a graph showing the relationship between a line width and a shift from a focal point of a resist pattern formed by Case A wherein usual resist and a normal illumination system are used.

Prior to the description of embodiments, a normal exposure system using vertical incidence and a modified exposure system using oblique incidence will be briefly described.

FIG. 1A shows a normal exposure system. Light 2 condensed when it passes through a condenser lens CL illuminates a mask 3. After the light passes through the mask 3, 0th order and ±1st order diffraction light fluxes 4a, 4b, and 4c are formed. The 0th order diffraction light 4a passes through a focusing lens 5 and is vertically incident upon a photosensitive member 7. The ±1st order diffraction light fluxes 4b and 4c are converged by the focusing lens 5 and focused on the photosensitive member 7 at its image point.

FIG. 1B shows a modified illumination system. Light radiated from a light source passes through a composite convergence lens and a condenser lens CL, and reaches an aperture 1 having holes displaced from the optical axis of the condenser lens CL. A light flux passed through the aperture 1 is obliquely incident upon a photomask 3, and forms diffraction light fluxes 4a, 4b, and 4c. Of the 0th order diffraction light 4a, −1st order diffraction light 4b, and +1st order diffraction light 4c, the light fluxes of only the 0th and +1st order diffraction light reach a projecting lens 5 which converges the light fluxes and focuses projecting light on a wafer 7.

Usual resist has transparency sufficient for exposure light, and has generally the same light absorption coefficient both before and after exposure. If dye is mixed with resist, the transparency of the resist lowers and the resist bleaches. Dye (bleaching agent) having a bleaching function has a characteristic that when it absorbs light, the light absorption saturates.

In the following, experiments and their results upon which the invention is based, will be described.

Stripe patterns of line-and-space of a resist film were formed by Cases A to E to be later described, the resist film being formed on a WSi thin film on a substrate having an irregular surface. The design width of a line pattern was 0.3 μm. The resist pattern forming conditions and obtained resist patterns by each Case will be described with reference to FIGS. 4A to 7E.

Case A: Exposure by usual resist and a stepper with a normal illumination system.

Resist films were patterned by using novolak positive resist (hereinafter called usual resist) commonly used and not containing dye and a stepper not having a modified illumination system but having a normal illumination system in which principal illumination light propagates along the optical axis.

After a novolak resist film was spin-coated on a WSi film to a thickness of 0.76 μm, it was pre-baked for 60 seconds at about 110° C. Exposure was performed by using an i-line stepper of a general 1/5 reduction exposure system without a modified illumination system. Exposure energy was 345 mJ/cm$^2$. After the exposure, the substrate was immersed in aqueous solution of 2.38 weight(W) % tetramethylammoniumhydroxide (TMAH) for 60 seconds to develop the novolak resist film and form a stripe pattern.

FIG. 4A is a graph showing the relationship between a line width and a shift from a focal point of each resist pattern during the exposure. The abscissa represents a shift from a focal point. A focal point is set at the center of the abscissa at 0, and the shift from the focal point is shown on both the sides of the focal point. The ordinate represents a resist line width actually obtained after development. The measurements were performed at five positions MP-1 to MP-5 for each sample.

As shown in FIG. 4A, a change in pattern width relative to the shift from the focal point was large. In some measurement, at a focal point shift of −0.6 μm the line width was narrowed by −0.06 μm from the design value. The depth of focus estimated from these data was 0.3 μm.

FIGS. 4B to 4E are sketches of photographs showing an enlarged image of the surface of each resist pattern. A shift from a focal point is indicated by a F value on each sketch. These sketches of photographs are for the F values or shifts from the focal point of −0.6 μm, −0.4 μm, 0.0 μm, and +0.6 μm. Vertical four lines as seen in the sketches are resist patterns. The warp of each pattern line in the right and left is the designed pattern, and the designed line width is 0.3 μm constant.

Figure 4B:
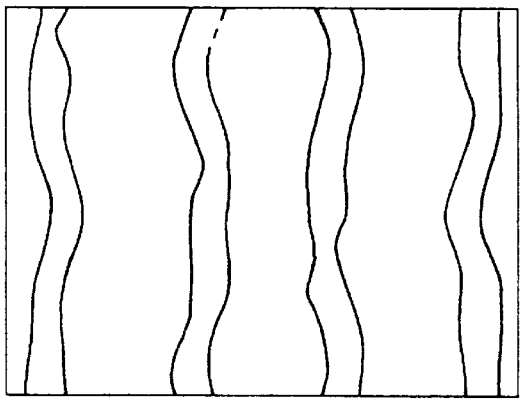
FIGS. 4B to 4E are sketches of photographs showing an enlarged image of each fine resist pattern formed on a substrate by Case A.
Figure 4C:
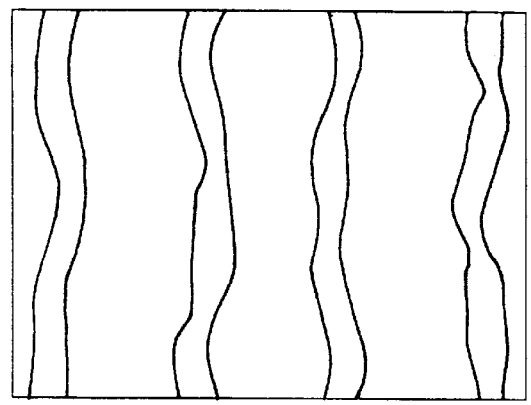
Figure 4D:
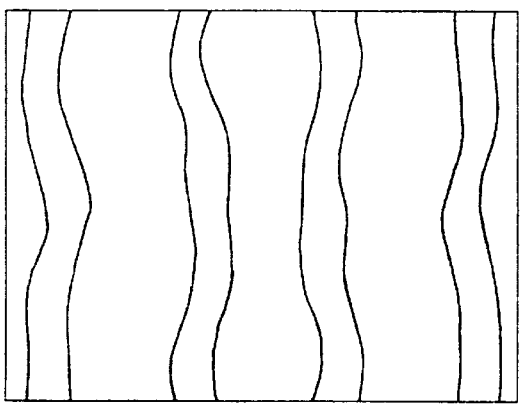
Figure 4E:
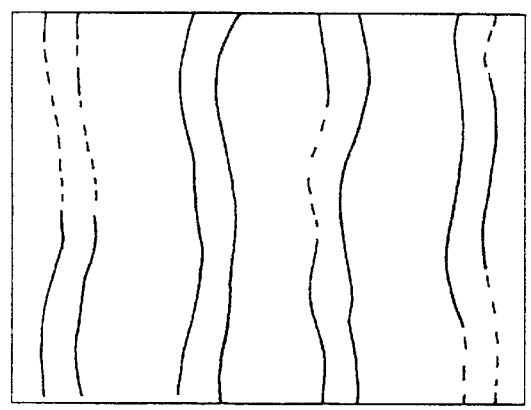
Figure 5B:
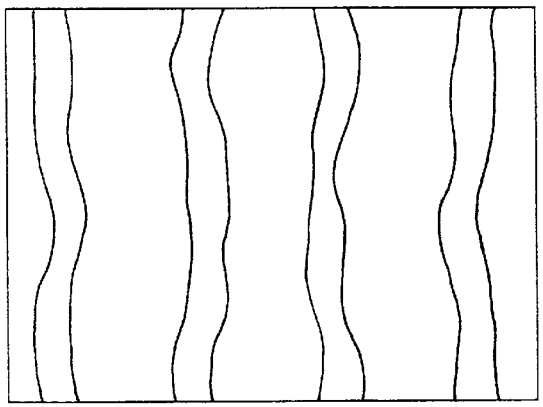
FIGS. 5B to 5E are sketches of photographs showing an enlarged image of each fine resist pattern formed on a substrate by Case B.
Figure 5C:
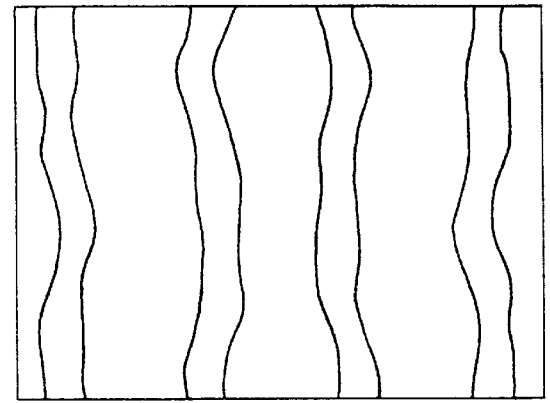
Figure 5D:
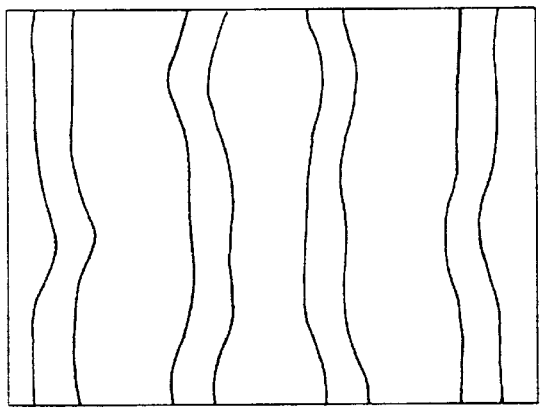
Figure 5E:
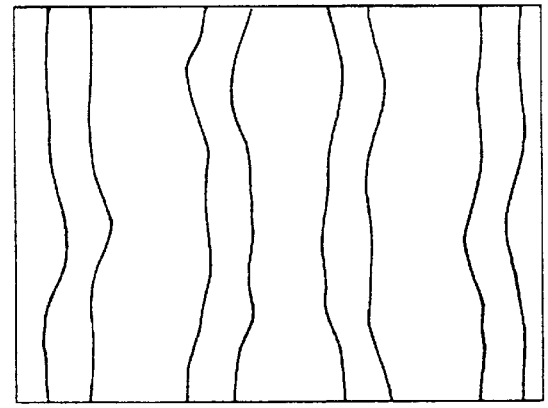

Of the formed resist patterns, partially thinned lines as indicated in FIGS. 4B and 4C were observed in many cases. These thinned patterns are considered as resulting from halation, which are fatal defects in photolithography.

Case B: Exposure by usual resist and a stepper with a modified illumination system.

Similar to Case A, after a novolak positive resist film was spin-coated on a WSi film to a thickness of 0.76 μm, it was pre-baked. Exposure was performed by using an i-line stepper of a ⅕ reduction exposure system with a modified illumination system. For the modified illumination, an aperture was used which was formed with concentrically symmetric four holes offset from the optical axis. Exposure energy was 369 mJ/cm². After the exposure, the substrate was immersed in aqueous solution of 2.38 W % TMAH for 60 seconds to develop the resist film. The exposure pattern same as Case A was used, and the designed line width was 0.3 μm.

As shown in FIG. 5A, at the focal point shift range of −0.8 μm to +0.8 μm the resist pattern line width was able to be set in the range of −0.02 μm to +0.045 μm as a difference from the design value. The depth of focus estimated from these data was 1.7 μm which was considerably deeper than Case A using a stepper with the normal illumination system.

The depth of focus was improved in Case B by using a stepper with the modified illumination system.

FIGS. 5B to 5E are sketches of photographs showing an enlarged image of the surface of each sample for F=−0.6, −0.4, 0.0, and +0.6 μm. As seen from FIGS. 5B to 5E, many of the formed resist patterns had partially thinned lines, similar to Case A.

If usual resist is used as in Cases A and B, it is difficult to eliminate halation to be caused by the influence of reflected light from the surface of an underlie layer on the substrate.

This phenomenon is illustrated in FIGS. 2A and 2B. Consider as shown in FIG. 3A that a resist film 17 is spin-coated on a conductive film 13 formed on an irregular substrate 12. When the resist film 17 is exposed, incident light 16 passes through the resist film 17 and is reflected at the surface of the underlie conductive film 13.

A step indicated by β in FIG. 2A may converge reflected light, like light reflection by a concave mirror. This phenomenon is called halation. In this manner, light is concentrically applied to a resist film at the area where light should not be applied. After the exposure, a resist pattern having a partially thinned portion γ shown in FIG. 2B is formed.

Partially thinned resist patterns by Cases A and B are considered as resulting from the influence of halation. The thinned pattern line width is directly reflected upon a thinned wiring pattern or the like, and degrades the fundamental performance of semiconductor devices.

It is considered that relieving the influence of halation is essential.

Case C: Exposure by dye-containing resist and a stepper with a normal illumination system.

Resist films were tried to be patterned by using dye-containing resist which relieves the influence of light reflected from an underlie layer on a substrate and a stepper with a normal illumination system.

FIGS. 3A and 3B illustrate the function of dye-containing resist. As shown in FIG. 3A, a resist film 14 containing dye is formed on a conductive film 13 on an irregular substrate 12. When the resist film 14 is exposed through a photomask 15, light 16 incident upon the resist film 14 attenuates while it passes through the resist film 14 containing dye. Since the intensity of light lowers as light passes through the resist film 14, the intensity of reflected light becomes weak. Therefore, many factors of deforming a resist pattern, such as standing waves, scattering and converging of reflected light, can be suppressed.

The dye-containing resist used by Case C was usual novolak dye-containing resist. The A value of this dye-containing resist was 0.98 and the B value was 0.55. These A and B values are indices representative of opaqueness of resist before exposure. The A value is an extinction coefficient of light absorbing components which are bleached during exposure, and the B value is an extinction coefficient of light absorbing components which are not bleached during exposure. The B value of usual novolak resist is about 0.05.

Similar to usual resist, after a resist film was spin-coated on a WSi film to a thickness of 1.2 μm, it was pre-baked for 60 seconds at a temperature of about 110° C.

Exposure was performed by using an i-line stepper of a ⅕ reduction exposure system with a normal illumination system. Exposure energy was 220 mJ/cm². After the exposure, the substrate was immersed in aqueous solution of 2.38 W % TMAH for 60 seconds to develop the resist film.

Although it was expected that use of dye-containing resist was able to relieve the influence of reflection from the underlie layer on a substrate, a resist pattern of 0.3 μm was not formed after development.

FIG. 3B illustrates a pattern of dye-containing resist after development, particularly the pattern by Case C. Although dye-containing resist can attenuate light reflected from an underlie layer on a substrate, the intensity of exposure light itself incident upon resist is also lowered. If dye-containing resist at a deep position near the surface of the underlie layer cannot receive a sufficient amount of exposure light, the pattern cross section after development has a skirt portion as indicated at α in FIG. 3B. If the lines are close to each other, the skirts may overlap each other. Therefore, a fine pattern cannot be formed.

Although any halation was not observed in a resist film by Case C, a pattern image was not able to be formed and the practical value of dye-containing resist was not recognized. If dye-containing resist cannot be used for the prevention of halation, a countermeasure left is only the use of an antireflection film.

Case D: Exposure by dye-containing resist and a stepper with a modified illumination system.

Resist films were patterned by using dye-containing resist and a stepper with a modified illumination system.

The dye-containing resist used was the same as Case C. After a resist film was spin-coated on a WSi film to a thickness of 1.2 μm, it was pre-baked for 60 seconds at a temperature of about 110° C. Exposure was performed by using an i-line stepper of a ⅕ reduction exposure system with a modified illumination system. Exposure energy was 240 mJ/cm². After the exposure, the substrate was immersed in aqueous solution of 2.38 W % TMAH for 60 seconds to develop the resist film and form a resist pattern.

If the normal illumination system is used as Case C, the dye-containing resist was unable to perform image formation itself. However, image formation was possible by using the modified illumination system.

Figure 6A:
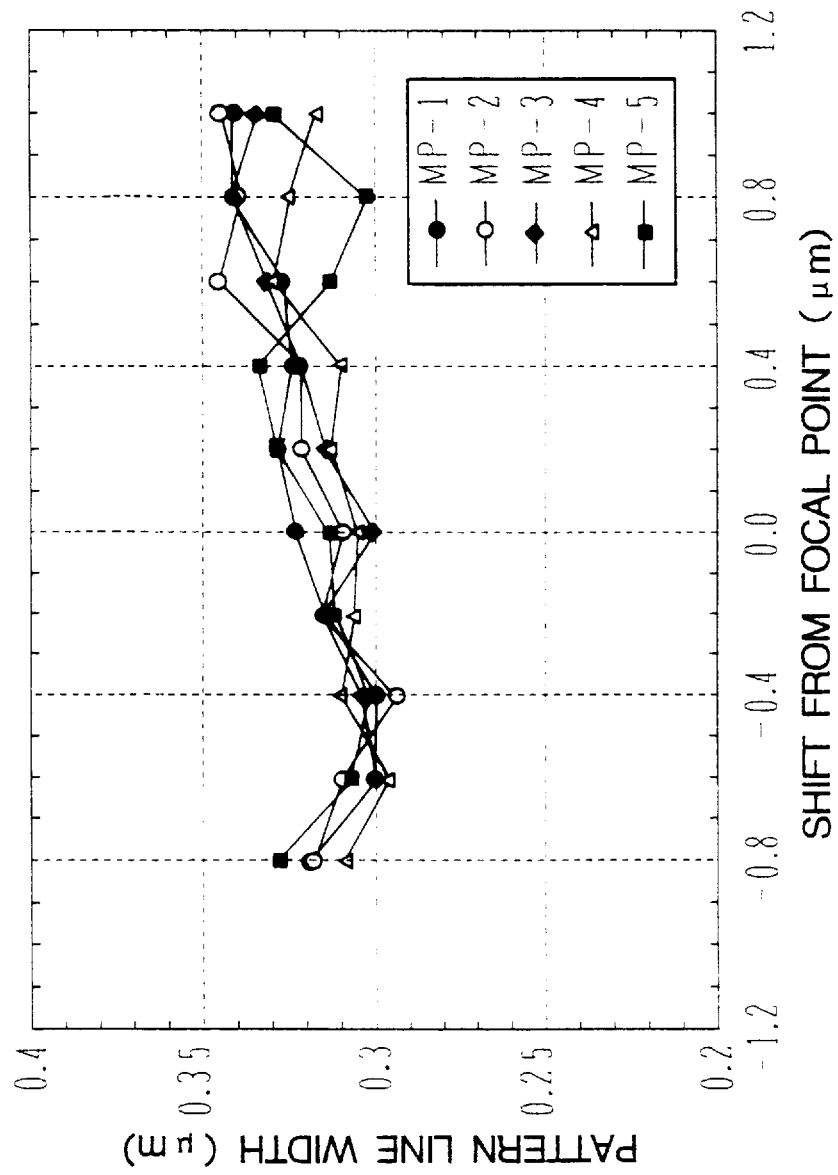
FIG. 6A is a graph showing the relationship between a line width and a shift from a focal point of a resist pattern formed by Case D wherein dye-containing resist and a modified illumination system are used.
Figure 6B:
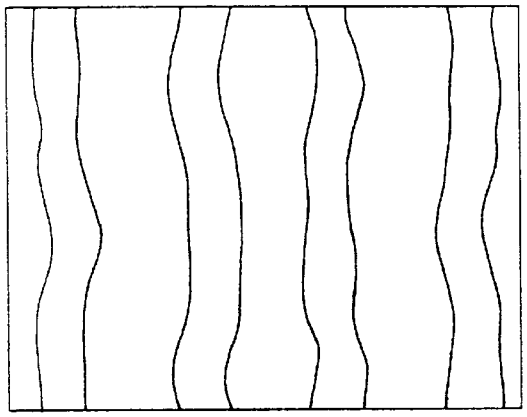
FIGS. 6B to 6E are sketches of photographs showing an enlarged image of each fine resist pattern formed on a substrate by Case D.
Figure 6C:
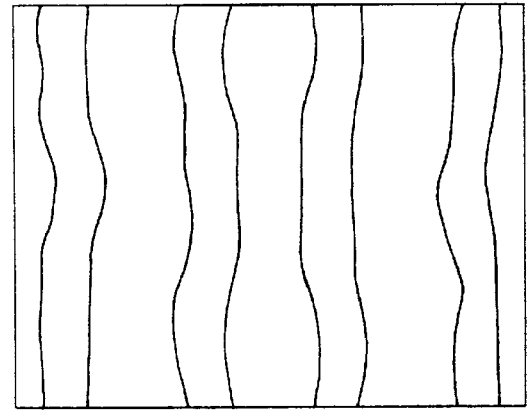
Figure 6D:
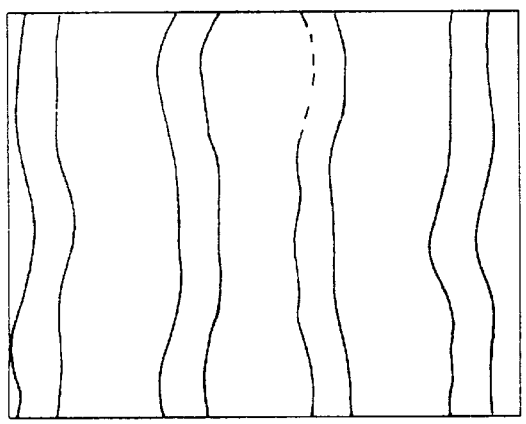
Figure 6E:
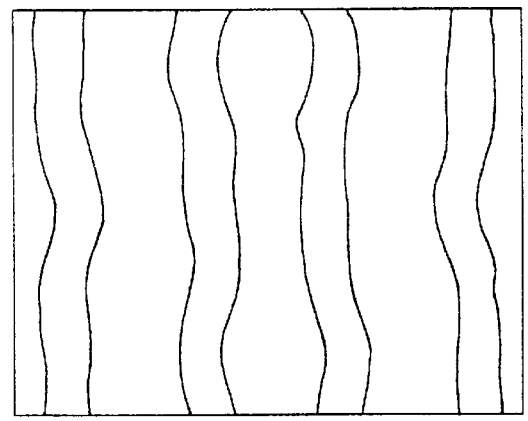

As shown in FIG. 6A, at the focal point shift range of −0.8 μm to +0.8 μm the resist pattern line width was able to be set in the range of −0.02 μm to +0.045 μm as a difference from the design value. The depth of focus estimated from these data was 1.7 μm which was practically sufficient like Case B.

As shown in FIGS. 6B to 6E, the formed resist patterns were well-shaped and had a constant width without any partially thinned portion. FIGS. 6B to 6E are sketches of photographs showing an enlarged image of the surface of each sample for F=−0.6, −0.4, 0.0, and +0.6 μm.

The above experiment results show that an image-forming ability of dye-containing resist is substantially improved if exposure is performed by using a stepper with a modified illumination system. The term "image-forming ability" does not simply indicate a resolution representing to what degree a fine pattern can be resolved, but also indicates a basic performance whether an image of a pattern can be actually formed.

Next, the relationship between the optical system of a modified illumination system and the resolution of dye-containing resist will be explained.

In the optical system of a stepper with the normal illumination system, if the position of a wafer is displaced from a focal point, a difference of an optical path length between the vertically incident 0th order light and obliquely incident ±1st order light becomes large. A depth of focus depends on this optical path length. In the optical system with the modified illumination system, both the 0th and +1st order light fluxes are set to be obliquely incident and the optical path length difference can be made small. Therefore, the optical path length difference between two light fluxes interfering on the surface of a wafer is made small and a good focusing condition can be maintained. The depth of focus can therefore be improved.

FIG. 1C illustrates a difference of an optical path of the +1st order diffraction lights incident upon resist, between exposure by a stepper with the ordinary illumination system and exposure by a stepper with the modified illumination system. A light flux of +1st order diffraction light 8 by using a stepper with the normal illumination system is tilted by a diffraction angle of 1st order diffraction light, relative to vertically incident 0th order light. In contrast, a light flux of +1st order diffraction light 6 by using a stepper with the modified illumination system is tilted by a diffraction angle of 1st order diffraction light, relative to 0th order light tilted in the opposite direction. Specifically, a light flux of +1st order diffraction light 6 by using a stepper with the modified illumination system is incident upon the surface of resist at an angle nearer to a vertical angle. Therefore, an optical path length of the incident light 6 upon the surface of the underlie layer on a substrate is shorter than the incident light 8 using the normal illumination system.

Improvement of the resolution of dye-containing resist by Case D is considered as resulting from the following facts. Since the modified illumination system is used, a difference of an optical path length to the surface of an underlie layer becomes small and the maximum optical path length becomes short. Therefore, the attenuation amount of + 1st order light in dye-containing resist is lowered and good interference is obtained.

It is generally said that the resolution of photolithography can be improved by using the modified illumination system irrespective of whether dye-containing resist is used. This is because an angle between adjacent light fluxes can be broadened more than the normal illumination system, when 0th and 1st order light fluxes are received by the projecting lens. Improvement of the resolution of dye-containing resist of this embodiment is therefore essentially different from improvement of the resolution by broadening the angle between adjacent light fluxes.

As above, in Case D using a combination of a stepper with the modified illumination system and dye-containing resist, a deeper depth of focus and relieving the influence of reflected light were able to be realized, and the resolution of dye-containing resist was able to be substantially improved.

More in particular, the merits of dye-containing resist and the modified illumination system were positively utilized, the problems which occur when the dye-containing resist and the modified illumination system are independently used, were able to be compensated each other, and an excellent fine resist pattern forming method was able to be realized.

Case E: Exposure by dye-containing resist and a stepper with a modified illumination system.

Similar to Case D, resist films were patterned by using dye-containing resist and a stepper with a modified illumination system. A different point from Case D is only that an aperture of the stepper has a circular slit, and other conditions are the same as Case D.

Figure 7A:
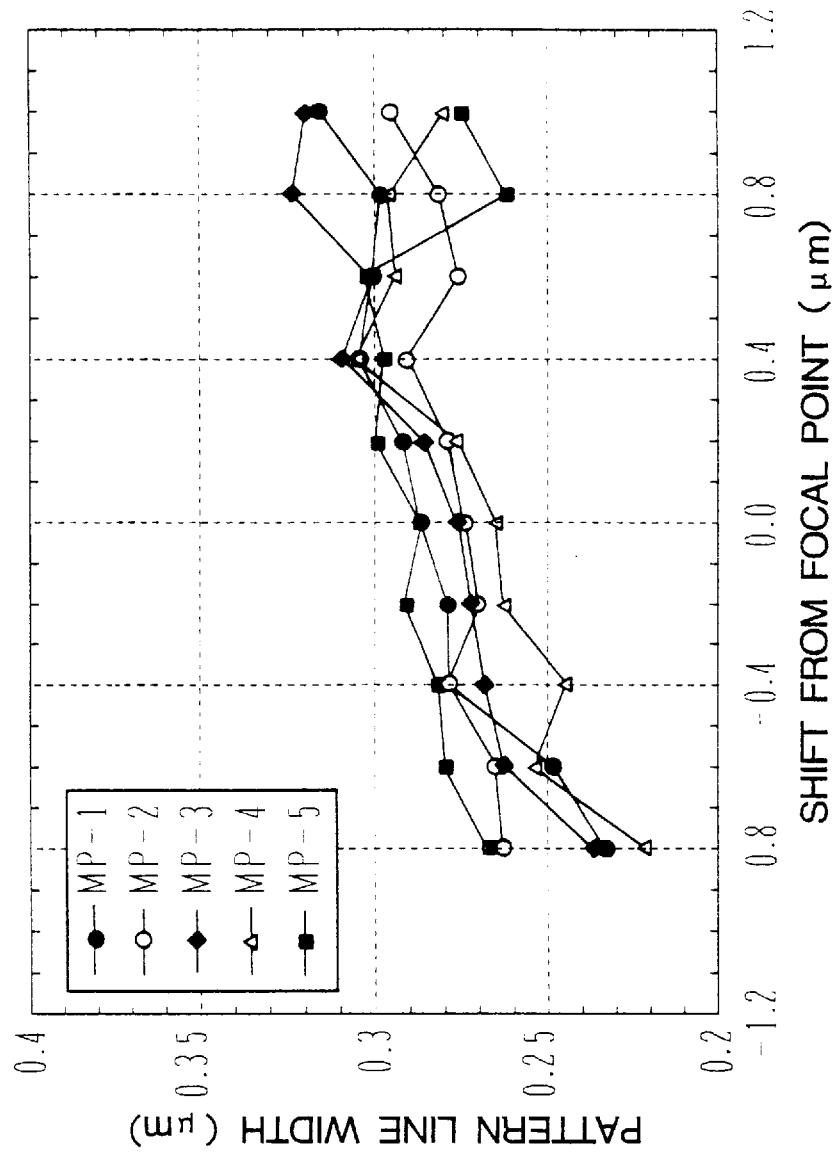
FIG. 7A is a graph showing the relationship between a line width and a shift from a focal point of a resist pattern formed by Case E wherein dye-containing resist and a modified illumination system are used.
Figure 7B:
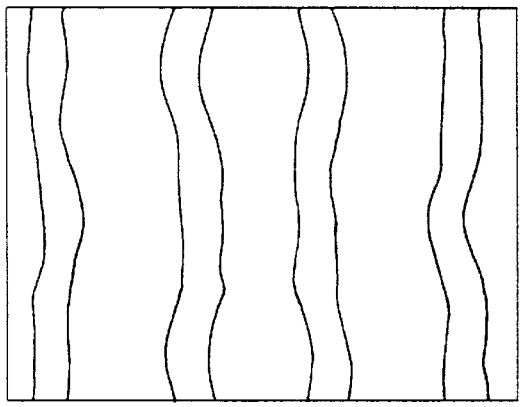
FIGS. 7B to 7E are sketches of photographs showing an enlarged image of each fine resist pattern formed on a substrate by Case E.
Figure 7C:
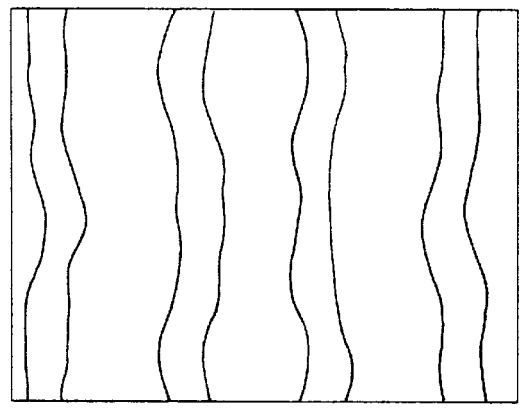
Figure 7D:
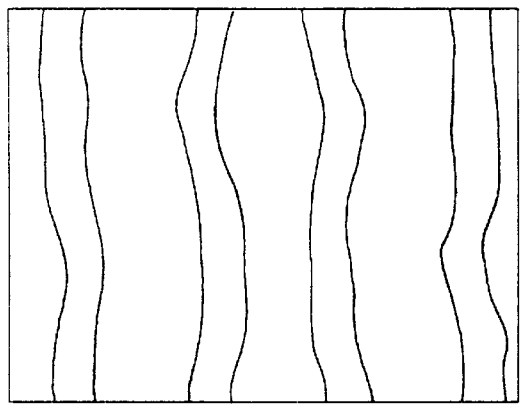
Figure 7E:
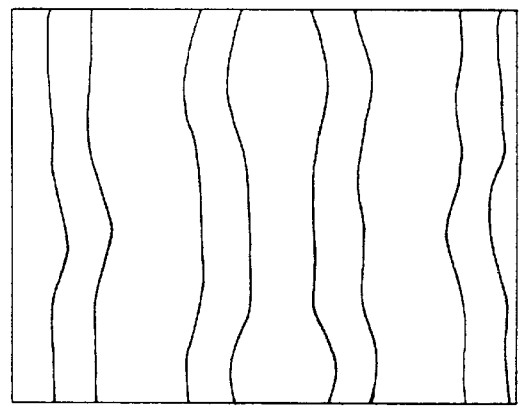

As shown in FIG. 7A, at the focal point shift range of −0.8 μm to +0.8 μm the resist pattern line width was able to be set in the range of −0.08 μm to +0.02 μm as a difference from the design value. The depth of focus estimated from these data was 1.3 μm which was practically sufficient.

FIGS. 7B to 7E are sketches of photographs showing an enlarged image of the surface of each sample for F=−0.6, −0.4, 0.0, and +0.6 μm. As shown in FIGS. 7B to 7E, the formed resist pattern lines had a constant width without any partially thinned portion.

Similar to Case D, also in Case E using the aperture with a different shape, a deeper depth of focus and relieving the influence of reflected light were able to be obtained.

As above, a combination of dye-containing resist and the modified illumination system can be realized only by changing resist and the aperture of a normal illumination system. Therefore, this combination contributes much to low cost without increasing the number of processes.

Next, resist films were patterned by using five types of dye-containing resist a to e having different light absorption characteristics and a stepper with the modified illumination system. The results were compared. In each of the five types, after a resist film was spin-coated on a WSi film to a thickness of 1.14 μm, it was pre-baked for 60 seconds at a temperature of about 110° C. Exposure was performed by using an i-line stepper of a ⅕ reduction exposure system with a modified illumination system. After the exposure, the substrate was immersed in aqueous solution of 2.38 W % TMAH for 60 seconds to develop the resist film and form a resist pattern of a design width of 0.3 μm. These conditions correspond to Case D.

In the following, the light absorption characteristics of each resist and the exposure conditions for each resist will be described.

Resist a

Resist a is the same type as the resist used in Case D. The A value was 0.98 and the B value was 0.55. The exposure energy was 240 mJ/cm$^2$. A light transmittance of the resist having the above-mentioned thickness was 17% before exposure and 53% after complete exposure.

Resist b

The A value was 0.85 and the B value was 0.50. The exposure energy was 375 mJ/cm$^2$. A light transmittance of the resist having the above-mentioned thickness was 21% before exposure and 56% after complete exposure.

Resist c

The A value was 0.59 and the B value was 0.38. The exposure energy was 320 mJ/cm$^2$. A light transmittance of the resist having the above-mentioned thickness was 33% before exposure and 65% after complete exposure.

Resist d

The A value was 0.92 and the B value was 0.25. The exposure energy was 515 mJ/cm$^2$. A light transmittance of the resist having the above-mentioned thickness was 26% before exposure and 75% after complete exposure.

Resist e

The A value was 0.94 and the B value was 0.20. The exposure energy was 455 mJ/cm$^2$. A light transmittance of the resist having the above-mentioned thickness was 27% before exposure and 80% after complete exposure.

When two types of resist d and e having a relatively high light transmittance after complete exposure were used, an image of a resist pattern itself was not formed and also a good resist pattern was not obtained. The formed resist pattern had a corrugated portion possibly because of halation.

When two types of resist a and b having a relatively low light transmittance after complete exposure were used, a good resist pattern was obtained. The depth of focus was 1.5 $\mu$m for the resist a and 1.2 $\mu$m for the resist b, which are deeper than the ordinary value.

The type of resist c was able to suppress halation and a good resist pattern was obtained with a depth of focus of 0.9 $\mu$m, although it has a higher light transmittance before exposure than the resist d, and e. This may be considered as resulting from the lower light transmittance after complete exposure than the resist d and e.

From these results, it can be said that in order to suppress the reflection of exposure light from an underlie layer and prevent the generation of halation, it is required to suppress the light transmittance after complete exposure than that before exposure.

From the results of the resist a, b, and c, it can be considered that the light transmittance after complete exposure is preferably set to about 65% or lower.

The light transmittance after complete exposure is mainly determined from a resist film thickness and the B value indicating an extinction coefficient of light absorbing components not bleached by exposure. If a resist film having a thickness of 1.14 $\mu$m is used, the light transmittance can be lowered to 65% and halation can be suppressed if the B value is set to the above-mentioned B value of 0.38 of the resist c or larger.

If a light transmittance is too small, a problem of a resolution arises even if exposure with the modified illumination system is performed. In the case of the resist a, the resist film had a thickness of 1.14 $\mu$m, the B value was 0.55 and the light transmittance after complete exposure was 53%. In this case, a sufficient resolution was obtained. Therefore, it can be said that the problem of resolution does not occur if the light transmittance after complete exposure is at least about 50%.

From these results, the following fact can be recognized. Specifically, if the resist film thickness and B value are selected so as to make the light transmittance after exposure fall in the range of about 50% to about 65%, and if a stepper with the modified illumination system is used in combination, it becomes possible to ensure a good resolution, suppress the generation of halation, and form a good resist pattern.

Even if resist is mixed with material other than dye and the light transmittance is adjusted, the same effects as dye-containing resist can be obtained. The light transmittance of resist can be adjusted by selecting the type of dye, the additive amount of dye, and a resist film thickness.

Dye-containing resist may be made of other than novolak resist, such as chemically amplified type resist and resist for short wavelength light. If the light transmittance of such resist is adjusted, the same effects as Cases D and E can be obtained.

In the above embodiment, an aperture with four holes and an aperture with a circle slit were used. Other aperture may be used in combination with the modified illumination system. Instead of regulating the light flux by the fixed shape of a hole or holes in an aperture, a method of forming a desired light flux by using a compound eye convergence lens (fly's eye lens) with a multiplicity of shutter mechanisms may be used to construct any desired modified illumination system.

In the above embodiment, a resist film is formed on a WSi film. The same effects as the embodiment can be obtained even if a resist film is formed on other high reflectivity underlie. For example, a resist film may be formed on a metal thin film layer such as Al, a refractory metal silicide thin film such as MoSi and TiSi which are a compound of refractory metal and Si. If exposure is performed by using short wavelength light such as excimer layer light, a reflection problem also occurs when the underlie layer is Si. Therefore, it is effective to use the above-described resist film patterning method in order to relieve the influence of reflection.

The present invention has been described in connection with the preferred embodiments. The invention is not limited only to the above embodiments. It is apparent to those skilled in the art that various modifications, modifications, combinations and the like can be made without departing from the scope of the appended claims.

We claim:

1. A pattern forming method comprising the steps of:

preparing an underlie layer having a surface to be processed;

coating a resist film on said underlie layer, the resist film comprising a substance capable of absorbing light applied during exposure, thereby capable of attenuating light reflected from the surface of said underlie layer during the exposure, in comparison to a resist film not containing the substance; and transferring a pattern of a photomask onto the resist by using a modified illumination system, the photomask, and a projecting lens, the modified illumination system radiating principal light from the direction offset from an optical axis of a condenser lens.

2. A pattern forming method according to claim 1, wherein said additive substance contains dye for absorbing light applied during the exposure.

3. A pattern forming method according to claim 2, wherein a content of said dye and a thickness of said resist film are adjusted so as to make a light transmittance of the resist film reduced into a range from about 50% to about 65% after complete exposure.

4. A pattern forming method according to claim 1, wherein the surface of said underlie layer includes a conductive material thin film made of a refractory metal silicide.

5. A pattern forming method according to claim 1, wherein said resist is novolak positive resist.

6. A pattern forming method, comprising the steps of:

preparing an underlie layer having a surface to be processed;

coating a resist film on said underlie layer, the resist film comprising a dye for absorbing light applied during exposure, thereby attenuating light reflected from the surface of said underlie layer during the exposure, in comparison to a resist film not containing the dye, the dye being capable of reducing pattern-forming ability and resolution when used in a normal illumination system in which principal illumination light is in a direction parallel with an optical axis of a condenser lens; and transferring a pattern of a photomask onto the resist by using a modified illumination system, the photomask, and a projecting lens, the modified illumination system radiating principal light from the direction offset from an optical axis of a condenser lens.

* * * * *